United States Patent
Kawamura et al.

(10) Patent No.: US 7,599,605 B2
(45) Date of Patent: *Oct. 6, 2009

(54) DATA RECORDING METHOD AND APPARATUS, DATA RECORDING MEDIUM, AND DATA REPRODUCING METHOD AND APPARATUS

(75) Inventors: Makoto Kawamura, Kanagawa (JP); Yasushi Fujinami, Kanagawa (JP)

(73) Assignee: Sony Corporation, Tokyo (JP)

( * ) Notice: Subject to any disclaimer, the term of this patent is extended or adjusted under 35 U.S.C. 154(b) by 1094 days.

This patent is subject to a terminal disclaimer.

(21) Appl. No.: 10/228,003

(22) Filed: Aug. 26, 2002

(65) Prior Publication Data

US 2002/0197062 A1  Dec. 26, 2002

Related U.S. Application Data

(63) Continuation of application No. 09/541,929, filed on Apr. 3, 2000, now Pat. No. 6,442,334, which is a continuation of application No. 08/530,301, filed on Oct. 31, 1995, now Pat. No. 6,075,920.

(30) Foreign Application Priority Data

Feb. 28, 2004  (JP)  ............................. P6-054706

(51) Int. Cl.
*H04N 7/00*  (2006.01)

(52) U.S. Cl. ..................... 386/95; 386/125; 386/126

(58) Field of Classification Search ........... 386/33, 386/40, 45, 68–69, 94–95, 109, 111–112, 386/124, 125, 126; 369/32.01, 47.1–47.55, 369/53.1–53.45, 59.1–59.27; 360/48

See application file for complete search history.

(56) References Cited

U.S. PATENT DOCUMENTS

| | | | |
|---|---|---|---|
| 4,541,093 A | 9/1985 | Furuya et al. | |
| 4,995,026 A | 2/1991 | Makabe et al. | |
| 5,182,678 A | 1/1993 | Hatanaka et al. | |
| 5,191,436 A | 3/1993 | Yonemitsu | |
| 5,243,582 A * | 9/1993 | Yamauchi et al. | ......... 369/30.04 |

(Continued)

FOREIGN PATENT DOCUMENTS

EP  0 553 816  8/1993

(Continued)

OTHER PUBLICATIONS

Jan van der Meer, "The full motion system for CD-I" IEEE Transactions on Consumer Electronics Nov. 1992, vol. 38, Issue: 4, pp. 910-920.*

*Primary Examiner*—Marsha D Banks Harold
*Assistant Examiner*—Christopher Findley
(74) *Attorney, Agent, or Firm*—Oblon, Spivak, McClelland, Maier & Neustadt, L.L.P.

(57) ABSTRACT

The present invention provides remarkably improved availability in a data recording method and apparatus, a data recording medium, and a data reproducing method and apparatus. By recording additional information for data reproduction in each sector on a data reproducing medium as a subcode separately from data when the data is recorded in the unit of sector, reproduction of data can be controlled using the subcode, thus making it possible to remarkably improve the availability of the data recording medium.

6 Claims, 9 Drawing Sheets

STRUCTURE OF SUBCODE (5)

| FIELD NAME | NUMBER OF BYTES |
|---|---|
| SECTOR NUMBER | 4 |
| COPYRIGHT (DIGITAL VIDEO) | 1 |
| COPYRIGHT (ANALOG VIDEO) | 1 |
| COPYRIGHT (DIGITAL AUDIO) | 1 |
| COPYRIGHT (ANALOG AUDIO) | 1 |
| SPARE | 6 |
| TOTAL | 1 4 |

U.S. PATENT DOCUMENTS

| | | | | |
|---|---|---|---|---|
| 5,245,600 | A * | 9/1993 | Yamauchi et al. | 369/47.16 |
| 5,282,186 | A * | 1/1994 | Yoshio et al. | 369/47.21 |
| 5,287,468 | A | 2/1994 | Furuhashi et al. | |
| 5,301,172 | A * | 4/1994 | Richards et al. | 369/30.04 |
| 5,325,352 | A * | 6/1994 | Matsumoto | 369/275.1 |
| 5,377,051 | A | 12/1994 | Lane et al. | |
| 5,428,598 | A * | 6/1995 | Veldhuis et al. | 369/275.3 |
| 5,434,991 | A | 7/1995 | Maeda et al. | |
| 5,453,968 | A * | 9/1995 | Veldhuis et al. | 369/47.12 |
| 5,455,684 | A | 10/1995 | Fujinami et al. | |
| 5,530,750 | A * | 6/1996 | Akagiri | 704/500 |
| 5,535,008 | A | 7/1996 | Yamagishi et al. | |
| 5,537,387 | A | 7/1996 | Ando et al. | |
| 5,548,599 | A | 8/1996 | Furuhashi et al. | |
| 5,561,649 | A | 10/1996 | Lee et al. | |
| 5,568,274 | A | 10/1996 | Fujinami et al. | |
| 5,570,331 | A | 10/1996 | Akashi | |
| 5,596,564 | A * | 1/1997 | Fukushima et al. | 386/70 |
| 5,598,276 | A | 1/1997 | Cookson et al. | |
| 5,602,956 | A | 2/1997 | Suzuki et al. | |
| 5,614,938 | A | 3/1997 | Sugiyama et al. | |
| 5,619,483 | A | 4/1997 | Yokota et al. | |
| 5,646,795 | A | 7/1997 | Suzuki | |
| 5,666,336 | A | 9/1997 | Yoshida | |
| 5,745,641 | A | 4/1998 | De Haan et al. | |
| 6,075,920 | A | 6/2000 | Kawamura et al. | |
| 6,243,220 | B1 | 6/2001 | Aoki et al. | |

FOREIGN PATENT DOCUMENTS

| | | |
|---|---|---|
| EP | 0 606 868 | 7/1994 |
| EP | 0 686 973 | 12/1995 |
| WO | WO 94 07332 | 3/1994 |

* cited by examiner

DATA RECORDING FORMAT

| FIELD NAME | NUMBER OF BYTES |
|---|---|
| SYNC PATTERN | 4 |
| CRC | 2 |
| SUBCODE | 14 |
| USER DATA | 2048 |
| EDC | 4 |
| ECC | 308 |
| TOTAL | 2380 |

FIG. 3

FORM OF SYNCHRONIZATION PATTERN

| 0x48 | 'H' |
|---|---|
| 0x44 | 'D' |
| 0x43 | 'C' |
| 0x44 | 'D' |

FIG. 5

STRUCTURE OF SUBCODE (1)

| FIELD NAME | NUMBER OF BYTES |
|---|---|
| SECTOR NUMBER | 4 |
| TIME CODE | 4 |
| SPARE | 6 |
| TOTAL | 14 |

FIG. 6

STRUCTURE OF SUBCODE (2)

| FIELD NAME | NUMBER OF BYTES |
|---|---|
| SECTOR NUMBER | 4 |
| ENTRY POINT INFORMATION | 1 |
| SPARE | 9 |
| TOTAL | 14 |

FIG. 7

STRUCTURE OF SUBCODE (3)

| FIELD NAME | NUMBER OF BYTES |
|---|---|
| SECTOR NUMBER | 4 |
| PICTURE HEADER INFORMATION | 1 |
| SPARE | 9 |
| TOTAL | 14 |

FIG. 8

STRUCTURE OF SUBCODE (4)

| FIELD NAME | NUMBER OF BYTES |
|---|---|
| SECTOR NUMBER | 4 |
| TEMPORARY REFERENCE | 2 |
| SPARE | 8 |
| TOTAL | 14 |

FIG. 9

STRUCTURE OF SUBCODE (5)

| FIELD NAME | NUMBER OF BYTES |
|---|---|
| SECTOR NUMBER | 4 |
| COPYRIGHT (DIGITAL VIDEO) | 1 |
| COPYRIGHT (ANALOG VIDEO) | 1 |
| COPYRIGHT (DIGITAL AUDIO) | 1 |
| COPYRIGHT (ANALOG AUDIO) | 1 |
| SPARE | 6 |
| TOTAL | 14 |

FIG. 10

DATA FORMAT OF TIME CODE (1)

| FIELD NAME | RANGE OF VALUE | NUMBER OF BITS |
|---|---|---|
| HOUR (TENS DIGIT) | 0~23 | 4 |
| HOUR (UNITS DIGIT) | | 4 |
| MINUTE (TENS DIGIT) | 0~59 | 4 |
| MINUTE (UNITS DIGIT) | | 4 |
| SECOND (TENS DIGIT) | 0~59 | 4 |
| SECOND (UNITS DIGIT) | | 4 |
| SECOND (1/10 DIGIT) | 0~9 | 4 |
| SECOND (1/100 DIGIT) | 0~9 | 4 |
| TOTAL | | 32 |

FIG. 11

DATA FORMAT OF TIME CODE (2)

| FIELD NAME | RANGE OF VALUE | NUMBER OF BITS |
|---|---|---|
| HOUR (TENS DIGIT) | 0~23 | 4 |
| HOUR (UNITS DIGIT) | | 4 |
| MINUTE (TENS DIGIT) | 0~59 | 4 |
| MINUTE (UNITS DIGIT) | | 4 |
| SECOND (TENS DIGIT) | 0~59 | 4 |
| SECOND (UNITS DIGIT) | | 4 |
| FRAME (TENS DIGIT) | 0~59 | 4 |
| FRAME (UNITS DIGIT) | | 4 |
| TOTAL | | 32 |

FIG. 12

DATA FORMAT OF TIME CODE (3)

| FIELD NAME | RANGE OF VALUE | NUMBER OF BITS |
|---|---|---|
| SPARE | – | 7 |
| DROP FRAME FLAG | 0~1 | 1 |
| HOUR | 0~23 | 5 |
| MINUTE | 0~59 | 6 |
| MARKER | 1 | 1 |
| SECOND | 0~59 | 6 |
| PICTURE | 0~59 | 6 |
| TOTAL | | 32 |

FIG. 13

FORMAT OF PICTURE HEADER INFORMATION (1)

| FIELD NAME | NUMBER OF BITS |
|---|---|
| SPARE | 7 |
| PICTURE HEADER FLAG | 1 |
| TOTAL | 8 |

FIG. 14

FORMAT OF PICTURE HEADER INFORMATION (2)

| FIELD NAME | NUMBER OF BITS |
|---|---|
| SPARE | 6 |
| PICTURE TYPE | 2 |
| TOTAL | 8 |

FIG. 15

FORMAT OF PICTURE HEADER INFORMATION (3)

| FIELD NAME | NUMBER OF BITS |
|---|---|
| SPARE | 5 |
| PICTURE HEADER FLAG | 1 |
| PICTURE TYPE | 2 |
| TOTAL | 8 |

FIG. 16

PICTURE TYPE

| 0 0 | I-PICTURE |
|---|---|
| 0 1 | P-PICTURE |
| 1 0 | B-PICTURE |
| 1 1 | SPARE |

FIG. 17

STRUCTURE OF SUBCODE (5)

| FIELD NAME | NUMBER OF BYTES |
|---|---|
| COPYRIGHT INFORMATION | 1 |
| LAYER INFORMATION | 1 |
| RESERVED | 1 |
| SECTOR NUMBER | 3 |
| TRACK NUMBER | 2 |
| APPLICATION IDENTIFICATION NUMBER | 1 |
| APPLICATION INFORMATION | 5 |
| TOTAL | 1 4 |

FIG. 18

STRUCTURE OF COPYRIGHT INFORMATION (1)

| FIELD NAME | NUMBER OF BITS |
|---|---|
| RESERVED | 6 |
| DUPLICATION CODE | 2 |
| TOTAL | 8 |

FIG. 19

DUPLICATION CODE

| DUPLICATION PERMITTED | 0 0 |
|---|---|
| RESERVED | 0 1 |
| DUPLICATION ONCE PERMITTED | 1 0 |
| DUPLICATION PROHIBITED | 1 1 |

FIG. 20

STRUCTURE OF LAYER INFORMATION

| FIELD NAME | NUMBER OF BITS |
|---|---|
| RESERVED | 2 |
| NUMBER OF LAYERS | 3 |
| LAYER NUMBER | 3 |
| TOTAL | 8 |

FIG. 21

NUMBER OF LAYERS

| SINGLE-LAYER DISC | 1 |
|---|---|
| TWO-LAYER DISC | 2 |
| RESERVED | 0,3..7 |

FIG. 22

LAYER NUMBER

| FIRST LAYER | 0 |
|---|---|
| SECOND LAYER | 1 |
| RESERVED | 2..7 |

FIG. 23

APPLICATION IDENTIFICATION NUMBER

| APPLICATION INFORMATION IS ALL ZERO | 0 |
|---|---|
| DVD | 1 |
| AUDIO | 2 |
| EMPTY SECTOR | 254 |
| RESERVED | 3..253,255 |

FIG. 24

DATA RECORDING METHOD AND APPARATUS, DATA RECORDING MEDIUM, AND DATA REPRODUCING METHOD AND APPARATUS

CROSS REFERENCE TO RELATED APPLICATIONS

This is a continuation of U.S. patent application Ser. No. 09/541,929, filed Apr. 3, 2000 now U.S. Pat. No. 6,44,334, which is a continuation of application Ser. No. 08/530,301, filed Oct. 31, 1995, now issued as U.S. Pat. No. 6,075,920.

TECHNICAL FIELD

The present invention relates to a data recording method and apparatus, a data recording medium, and a data reproducing method and apparatus. The present invention may be applicable, for example, to a method and an apparatus for recording and reproducing video data, audio data, caption data, and data composed of a plurality of these data as well as data produced on a computer in accordance with the stipulation of ISO11172 (MPEG1) or ISO13818 (MPEG2).

BACKGROUND ART

Heretofore, a data recording medium such as a compact disc (a trade mark) has additional information data (subcode) recorded thereon for realizing random access, in addition to information to be primarily reproduced. The information to be primarily reproduced is subjected to a mechanism for correcting errors with information located before and behind the errors. Specifically, CIRC (Cross Interleaved Reed-Solomon Code) or the like is added to the information for countermeasures to such errors.

Thus, data can be utilized only after the lapse of a time required to read data before and behind certain data for performing the error correction processing and a time required to calculations for the error correction. Essentially, unlike reproducible data, the additional information data is required to be utilized in a shorter time after it is read from a data recording medium, so that the error correction processing is not performed for the additional information data, or different error correction processing with a different calculation method from that for data to be primarily reproduced is employed for the additional information data.

As additional information data for randomly accessing a data recording medium, the most necessary data is information indicative of the position of data on the data recording medium, i.e., the address. Since the compact disc or the like is a data recording medium which was originally created for recording audio data and is characterized in that information is recorded at a fixed bit rate, information (address) for specifying each read-out unit (sector) on the data recording medium is represented by a numerical value based on the hour, minute, second and frame, i.e., information (time code) on reproduction passing time from the head of reproduced data.

Due to the characteristic of the compact disc that information is recorded at a fixed bit rate, audio data reproduction passing time information (time code) on the disc increases in proportion to an increase in the distance (address) of data from the head position thereof on the data recording medium, i.e., the disc. Consequently, designation of a particular read-out unit (sector) on the data recording medium may also be realized by specifying the reproduction passing time represented by hour, minute, second and frame.

However, since this address based on hour, minute, second and frame is denoted based on a 60-adic number or a 75-adic number utilizing the number of frames per second, this address cannot be used as it is for a data recording medium used by a computer system which basically specifies addresses with binary codes (which may be denoted in hexadecimal). Thus, the MD (Mini-Disc (a trade mark)) standard and so on employ a binary form as the address for specifying a sector. In this case, although a search cannot be made directly with reproduction passing time information (time code), since information is recorded at a fixed bit rate on the mini-disc and so on, conversion from a binary-form sector address to the reproduction passing time information (time code) can be realized by a proportional calculation.

However, if the bit rate of information varies, the correspondence between the conventional reproduction passing time information represented by hour, minute, second and the number of frames and a sector address cannot be calculated. With a varying bit rate, even if the time code was used as a second address, the rate of increase in the reproduction passing time information (time code) would be different between a higher bit rate portion and a lower bit rate portion, whereby two or more sectors would exist having the same passing time information (time code), or two adjacent sectors would not always have sequential passing time information (time code), causing a problem that the time code is not appropriate as the sector address for specifying a position of data on the data recording medium.

Also, as video data recorded on a data recording medium, video data in conformity to the stipulation of ISO11172-2 (MPEG1 Video) or ISO1818-2 (MPEG2 Video) may be occasionally recorded. This video data suffers from technical restrictions on decoding. Specifically, the decoding cannot be performed from an arbitrary position of a bit stream, but must be always started from an I-picture. In a current video CD or the like, when a search is made on a data recording medium for starting to read data from an arbitrary position, the data read is not always started from head of an the I-picture, so that data cannot be utilized until the next I-picture is reached, causing a problem that the decoding cannot be started for this period.

For reproducing the video data, one may wish to selectively decode only I- and P-picture with a B-picture skipped, or one may wish to selectively decode only I-picture with B- and P-picture skipped. The conventional video CD's and so on, nevertheless, have a problem that they do not contain thereon information indicating at which position of a data recording medium picture data is accommodated and which of I-, P-, and B-picture data is accommodated, or information indicating the head position of such picture data, so that a picture of an arbitrary picture type cannot be selectively reproduced by a search operation.

Furthermore, since respective picture data of the video data, after encoded, are recorded in an order different from the order in which they are displayed, a temporal reference is described in a picture header of the video data for indicating the display order. However, no specific method has been thought for allowing the user to make a search by specifying a number of the temporal reference.

Also, the current data recording medium such as the compact disc has only one bit of management information on copyright, i.e., how to deal with duplication. More specifically, only one bit is assigned to information indicating whether duplication of data recorded on the data recording medium is prohibited or permitted. This limits to only two kinds of determinations, that is, duplication is prohibited or permitted. Thus, such insufficient management information implies a problem that it is impossible to achieve detailed copyright management in combination of a plurality of conditions including whether or not duplication is permitted in a converted analog data form; whether or not duplication is permitted in a digital data form; whether or not data may be output to computer equipment; whether or not data may be output to audio-visual equipment other than a computer; and so on, and that repetitive duplications cannot be restricted.

Also, in the current compact disc and so on, an additional information data portion for use in accessing certain data is provided in a fixed configuration, thus presenting few freedom for using the compact disc in a variety of ways, e.g., for using the compact disc so as to support a plurality of applications.

DISCLOSURE OF THE INVENTION

The present invention has been made in view of the foregoing aspects, and proposes a data recording method and apparatus, a data recording medium, and a data reproducing method and apparatus which are capable of solving the conventional problems at a stroke and remarkably improving the usability as a whole.

To solve the problems mentioned above, the present invention provides a data recording method for recording data in the unit of sector on a data recording medium, wherein additional information for data reproduction is recorded as a subcode in each sector separately from data.

The present invention also provides a data recording apparatus for recording data in the unit of sector on a data recording medium which comprises subcode generating means for generating a subcode as additional information for data reproduction in each sector separately from data recorded therein; and subcode adding means for recording data and the subcode in each sector.

The present invention also provides a data recording medium for recording data thereon in the unit of sector, wherein a subcode as additional information for data production is recorded in each sector separately from the data.

The present invention also provides a data reproducing method for reproducing a data recording medium which has a subcode serving as additional information for data reproduction recorded in each sector separately from data when the data was recorded in the unit of sector, wherein the subcode recorded in each sector is reproduced independently of reproduction of the data recorded in each sector for controlling the reproduction of the data.

The present invention also provides a data reproducing apparatus for reproducing a data recording medium which has a subcode serving as additional information for data reproduction recorded in each sector separately from data when the data was recorded in the unit of sector, which comprises main data reproducing means for reproducing the data recording in each sector; subcode reproducing means for reproducing the subcode recorded in each sector; and control means for controlling the reproduction of the data by the main data reproducing means based on the subcode reproduced by the subcode reproducing means.

By recording the additional information for data reproduction as a subcode in each sector separately from data when the data is recorded on a data recording medium in the unit of sector, the subcode can be used to control the data reproduction to remarkably improve the availability of the data recording medium.

Upon reproducing a data recording medium which has the subcode serving as additional information for data reproduction recorded in each sector separately from data when the data was recorded in the unit of sector, the subcode recorded in each sector is reproduced independently of the reproduction of the data recorded in each sector to control the data reproduction, thereby making it possible to support a variety of reproducing methods and provide improved usability.

BRIEF DESCRIPTION OF THE DRAWINGS

FIG. 3 is a table explaining a sector structure as an embodiment of a data recording format according to the present invention.

FIG. 5 is a table explaining a synchronization pattern in the sector structure in accordance with the data recording format of FIG. 3.

FIG. 6 is a table showing a structure for adding a time code to a subcode in the sector structure in accordance with the data recording format of FIG. 3.

FIG. 7 is a table showing a structure for adding entry point information to the subcode in the sector structure in accordance with the data recording format of FIG. 3.

FIG. 8 is a table showing a structure for adding picture header information to the subcode in the sector structure in accordance with the data recording format of FIG. 3.

FIG. 9 is a table showing a structure for adding a temporal reference to the subcode in the sector structure in accordance with the data recording format of FIG. 3.

FIG. 10 is a table showing a structure for adding copyright management information to the subcode in a sector structure in accordance with the data recording format of FIG. 3.

FIG. 11 is a table showing the contents of a time code which is added as the subcode of FIG. 6.

FIG. 12 is a table showing the contents of a time code which is added as the subcode of FIG. 6.

FIG. 13 is a table showing the contents of a time code which is added as the subcode of FIG. 6.

FIG. 14 is a table showing the contents of picture header information which is added as the subcode of FIG. 6.

FIG. 15 is a table showing the contents of picture header information which is added as the subcode of FIG. 6.

FIG. 16 is a table showing the contents of picture header information which is added as the subcode of FIG. 6.

FIG. 17 is a table showing picture types as the picture header information of FIGS. 15 and 16.

FIG. 18 is a table showing another structure of the subcode in the sector structure in accordance with the data recording format of FIG. 3.

FIG. 19 is a table showing the contents of copyright information which is added as the subcode of FIG. 18.

FIG. 20 is a table showing the contents of a duplication code field in FIG. 19.

FIG. 21 is a table showing the contents of a layer information field which is added as the subcode of FIG. 18.

FIG. 22 is a table showing the contents of a number of layers field in the layer information of FIG. 21.

FIG. 23 is a table showing the contents of a layer number field in the layer information of FIG. 21.

FIG. 24 is a table showing the contents of an application identification number field which are added as the subcode of FIG. 18.

BEST MODE FOR EMBODYING THE PRESENT INVENTION

One embodiment of the present invention will be described in detail with reference to the accompanying drawings.

(1) Data Recording Format (1-1) Sector Structure

A data recording medium according to this embodiment is a medium which is capable of recording and storing data thereon, for example, a compact disc, a magneto-optical disc, a hard disc, and so on, where user data including video data, audio data, caption data, data composed of a plurality of these data, and data produced on a computer as well as additional information including a subcode and so on are recorded by a data recording apparatus in a sector structure defined in accordance with a data recording format shown in FIG. 3 at a variable data rate.

Figure 4:
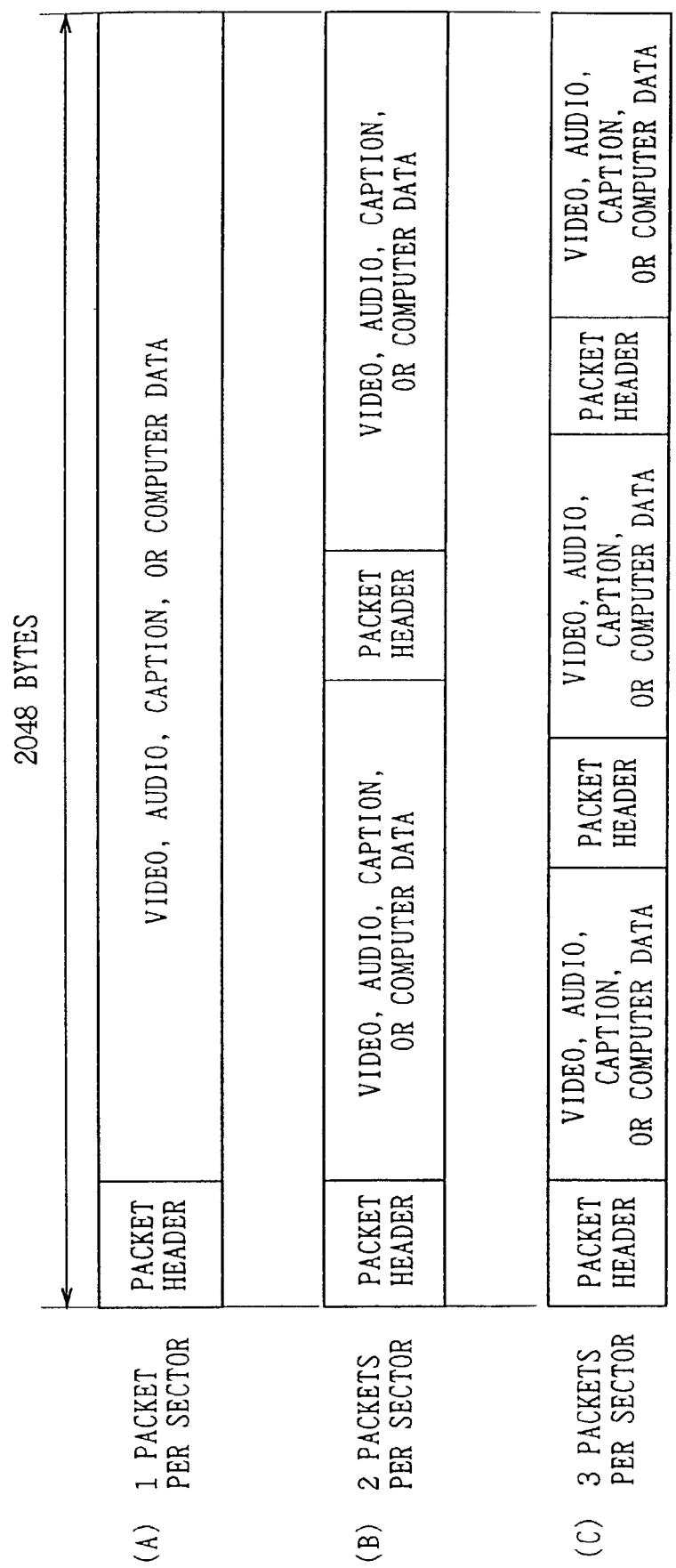
FIG. 4 is a schematic diagram explaining user data recorded in a sector structure in accordance with the data recording format of FIG. 3.

In third data recording format, the size of a user data field in a sector is selected to be 2,048 bytes. Also in this embodiment, one packet is defined so as not to extend over a plurality of sectors of user data, so that the length of one packet should be 2,048 bytes at maximum or less. The user data in each sector always has a packet header added at the head thereof, as shown in FIGS. 4(A)-4(C).

Actually, placed at the head of each sector is a four-bit synchronization pattern comprising one of fixed patterns as shown in FIG. 5 by which the head of each sector is detected. Subsequent to this synchronization pattern, a two-byte CRC (Cyclic Redundancy Check) code is calculated and added for a subcode which is placed behind the CRC code. The subcode added subsequent to the CRC code includes a variety of identification information on user data. The subcode has a 14-byte length. Subsequent to the subcode, the above-mentioned user data is added, followed by a four-byte CRC code calculated from and added for the subcode, the CRC code for the subcode and the user data. For the sake of convenience, the four-byte CRC code calculated from the subcode, CRC code and user data is called the "EDC". For these synchronization pattern, subcode, CRC code, user data, and EDC, two kinds of parities C1 and C2 having different interleave directions created in accordance with the cross interleaved Reed-Solomon code, i.e. 308 bytes of ECC (Error Correction Code) is added to complete a sector consisting of 2,380 bytes of recording data which is recorded on a data recording medium for storage and reproduction.

(1-2) Structure of Subcode

In the above described data recording format, four-byte time code information (FIG. 6), one-byte entry point information (FIG. 7), one-byte picture header information (FIG. 8), two-byte temporal reference information (FIG. 9), or four-byte copyright management information (FIG. 10) is used in addition to a four-byte sector number (a sector address) as the contents of the subcode, as shown in FIGS. 6-10.

Actually, with the sector number and the time code information being used for the subcode as shown in FIG. 6, the position of each sector can be specified even if data is recorded on a data recording medium at a variable data rate, the sector address can be specified in a manner suitable for a data recording medium used in a computer system, and a search using the time code information can be easily realized for reproduction, thus making it possible to extent applicable areas of the data recording medium.

A data format for the time code information may be implemented by a time code having fields of hour, minute, second, 1/10 second, and 1/100 second, as shown in FIG. 11. This is a data format commonly usable as the time code for video data, audio data and caption data. Time code information exclusive to video data may be implemented by a time code having fields of hour, minute, second, and a number of frames of a video signal, as shown in FIG. 12. In the case of FIGS. 11 and 12, all fields are described in a BCD (Binary Coded Decimal) notation.

A further data format for the time code information may employ a time code format stipulated in ISO13818-2 (MPEG2 Video) as shown in FIG. 13. Since this format permits a time code included in video data and a time code included in additional information to be analyzed by the same method, an analysis circuit or an analysis program can be shared by the video data and the additional information. Also, since respective fields of this format are described in a binary notation, the time code information can be written with a less amount of information than writing a time code described in a BCD notation into additional information. Thus, if a fixed length subcode is employed, further, information may be added thereto by the reduced amount.

The entry point information, stored in the subcode shown in FIG. 7, is flag information which is set only for a sector including the head position of a I-picture. Specifically explaining, this flag information, set only for a sector including the head position of an I-picture is provided such that when a data reproducing apparatus is adapted to start reading out data by detecting the flag information, the decoding can be initiated immediately from the head of the I-picture. In this way, reproduction can be started immediately after a high-speed search operation.

The picture header information, stored in the subcode shown in FIG. 8, may comprise a one-bit picture header flag which is set only for a sector including the head position of a picture as shown in FIG. 14; two-bit picture type information (indicative of an I-, P-. or B-picture) as shown in FIG. 15; or both of the picture header flag and the picture type information as shown in FIG. 16. As to the picture type, two-bit patterns are assigned to the I-picture, P-picture, and B-picture, respectively, as shown in FIG. 17. It should be noted that the two-bit pattern indicative of an I-picture is added as a subcode when at least I-picture data exist in a corresponding sector; the two-bit pattern indicative of a P-picture is added when I-picture data does not exist but P-picture data exists in a corresponding sector; and the two-bit pattern indicative of a B-picture is added when neither I-picture data nor P-picture data exist but B-picture data only exists in a corresponding sector.

By thus adding the picture header information to the subcode such that a reproducing apparatus detects it to control a data read operation, data can be initially read from the head position of a picture, or alternatively, selective reproduction based on the picture type can be implemented in such a manner that a picture to be decoded is read while a picture not to be decoded is skipped.

The temporal reference information, stored in the subcode shown in FIG. 9, refers to a temporal reference existing in a picture layer within a bit stream stipulated by ISO11172-2 (MPEG1 Video) or ISO13818-2 (MPEG2 Video) for indicating an order in which respective pictures are to be displayed. By thus providing the subcode with the temporal reference information such that a data reproducing apparatus starts reading data upon detecting the temporal reference information, the data reproducing apparatus can access to a picture with a temporal reference number specified by the user.

The copyright management information, stored in the subcode shown in FIG. 10, includes one-byte information indicating how to treat the copyright for each of digital video, analog video, digital audio, and analog audio data. The set of one-byte copyright information added as a subcode provides for copyright management in combination of a plurality of conditions in accordance with data creator or recorder's intention.

The subcode may also take a form shown in FIG. 18. As illustrated, when the subcode is formatted to include copyright information, layer information, sector number (sector address), track number, application identification number, and application information, this single structure subcode enables a data recording medium to support a variety of applications.

The copyright information shown in FIG. 18 indicates attributes with respect to duplication of user data included in an associated sector with a two-bit duplication code as shown in FIG. 19. The duplication code has two-bit patterns as shown in FIG. 20 which are assigned to attributes of "Duplication Permitted", "Duplication Once Permitted", and "Duplication Prohibited", respectively.

The layer information is used when a disc comprises a plurality of layers to indicate how many layers the disc including a sector is formed of, and which of the layers the sector is contained.

More specifically, the layer information in FIG. 18 represents information on a disc and a layer including a sector with three-bit fields denoted "Number of Layers" and "Layer Number" as shown in FIG. 21. "Number of Layers" is set to "1" when a disc including the sector is formed of a single layer, and to "2" when the disc is formed of two layers. Numerical values other than "1" and "2" are reserved.

"Layer Number", as shown in FIG. 23, is set to "0" when a layer including a sector is a first layer, and to "1" when it is a second layer. Numerical values other than "0" and "1" are reserved.

The track number shown in FIG. 18 is provided for realizing a mechanism of a track utilized for searching for the head of a music title on a compact disc or the like. The track is defined as a set of sequential sectors on a disc and denoted a track number.

The application identification number shown in FIG. 18 is provided for classifying the contents of information written in a user data portion of FIG. 3 in accordance with applications associated with the information. For example, supposing that a portion of a disc contains data for a so-called application DVD (Digital Video Disc), and the other portion contains data for another application (for example, an audio application), a different number is recorded in the application identification number field of the subcode associated with each data to allow easy discrimination of data for different applications upon reproduction. The application identification number is also used for defining the kind of information recorded in the application information field subsequent to the application identification number field.

FIG. 24 shows, by way of example, the definition of application identification number. When the application identification number is set to "0", the subsequent application information field is filled with "0".

Also, when the application identification number is set to "1", DVD (Digital Video Disc) data is recorded in the user data area of an associated sector, and information regarded to be important to DVD is written into the application information field. For example, the application information field may contain information on the entry point, described above with reference to FIG. 7 which is very important information for the MPEG standard used in DVD.

When the application identification number is set to "2", audio data is recorded in the user data area of an associated sector, so that information regarded to be important to audio is recorded in the application information field. For example, the sampling frequency, bit length, and so on of audio data are recorded to help the operation of a reproducing apparatus.

When the application identification number is set to "254", the user data area of an associated sector is filled with "0". The application identification number from "3" to "253" and "255" is reserved here.

According to the foregoing recording format, video data, audio data, caption data, data composed of a plurality of these data, and data produced on a computer are recorded in the unit of sector, and time code information, entry point information, picture header information, temporal reference information, or track number is added as a subcode to each sector in addition to a sector number, thus making it possible to realize a data recording medium which can remarkably improve the usability thereof for special reproduction, search and reproduction, and so on performed on the reproducing apparatus side, even if data is recorded thereon at a variable data rate.

Also, with the information on copyright added as a subcode to each sector, it is possible to realize a data recording medium with which detailed copyright management can be achieved for each sector on the reproducing apparatus side.

Further, with the layer information added as a subcode to each sector, it is possible to realize a data recording medium from which recorded data extending over a plurality of layers can be reproduced by a reproducing apparatus.

Furthermore, by recording the application identification number and the application information, information required by a variety of applications can be easily recorded in each subcode, thus making it possible to realize a data recording medium which can remarkably improve the usability.

(2) Data Recording Apparatus According to Embodiment

Figure 1:
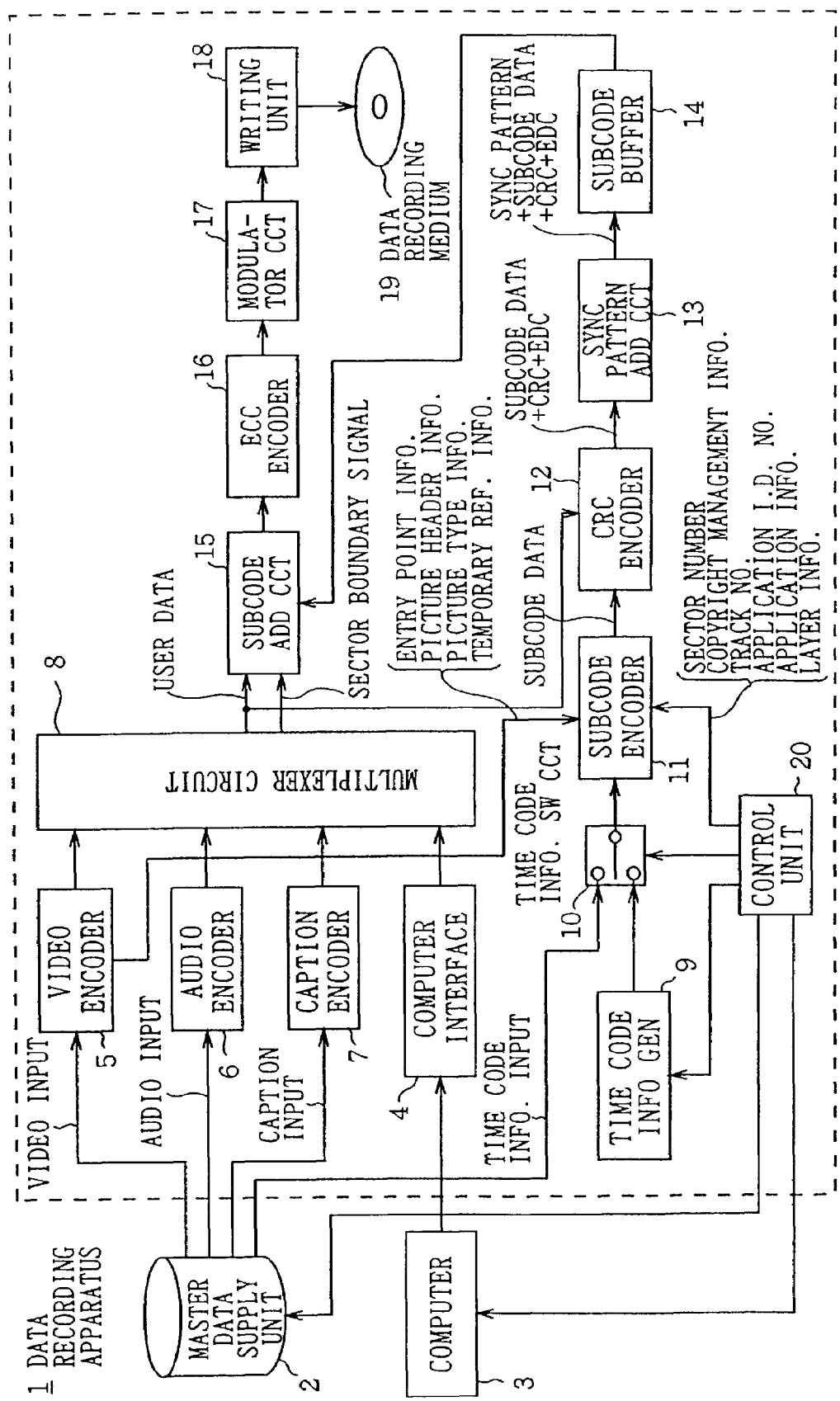
FIG. 1 is a block diagram showing the configuration of an embodiment of a data recording apparatus according to the present invention.

Referring to FIG. 1, reference numeral 1 generally designates a data recording apparatus which records data in the data recording format according to the present invention which has been described with reference to FIGS. 3-17 and 18-24. The data recording apparatus 1 of this embodiment multiplexes video data, audio data, caption data, a program composed of a plurality of these data, and data produced on a computer, adds additional information such as the subcode to the data, and records them on a data recording medium 19.

In this data recording apparatus 1, a master data supply unit 2, in response to a command from a control unit 20, supplies previously produced video data, audio data, and caption data to a video encoder 5, an audio encoder 8, and a caption encoder 7, respectively. This master data supply unit 2 comprises, for example, a video tape player for business use. When time code information is found in a sector together with video data, audio data and caption data, the master data supply unit 2 supplies the time code information to a time code information switching circuit 10.

A computer 3, in response to a command from the control unit 20, supplies a computer interface 4 with computer data to be recorded on the data recording medium 19. The computer interface 4 converts electric characteristics, signal format, data format, and so on of information sent from the computer 3, and supplies a multiplexer circuit 8 with the information converted but having the same contents.

The video encoder 5 encodes video data sent from the master data supply unit 2 in accordance with a coding procedure stipulated by ISO11172-2 (MPEG1 Video) or ISO13818-2 (MPEG2 Video), and supplies encoded video data to the multiplexer circuit 8. The video encoder 5 also supplies a subcode encoder 11 with entry point information indicative of a position at which I-picture data is found; picture header information indicative of a position at which a picture header is found; picture type information indicative of the type of a picture; and temporal reference indicative of an order in which respective pictures are displayed.

The audio encoder 6 supplies the multiplexer circuit 8 with audio data sent fro the master data supply unit 2 as it is or after encoding it in accordance with a coding procedure stipulated in ATRAC (Adaptive Transform Acoustic Coding) which complies with ISO11172-3 (MPEG1 Audio), ISO13818-3 (MPEG2 Audio) or MD (mini-disc) standard. The caption encoder 7 supplies the multiplexer circuit 8 with caption data sent from the master data supply unit 2 as it is or after subjecting it to run-length compress.

The multiplexer circuit 8 multiplexes data sent from the video encoder 5, audio encoder 6, caption encoder 7, and computer interface 4 in conformity to the stipulation of ISO11172-1 (MPEG1 System) or ISO13818-1 (MPEG2 System). In this event, the multiplexer circuit 8 receives an indication from the control unit 20 as to a processing unit of data which can be read from or written into the data recording medium 19 at a time, i.e., an amount of user data recorded in a sector, multiplexes data so as to prevent a packet from extending over user data areas in a plurality of sectors, and supplies multiplexed user data to a subcode adding circuit 15. Simultaneously with this, the multiplexer circuit 8 also supplies a sector boundary signal indicative of a boundary between sectors to the subcode adding circuit 15.

A time code information generator 9 generates time code information in response to a command from the control unit 20. The time code information switching circuit 10 selects one from time code information sent from the master data supply unit 2 and time code information sent from the time code information generator 9, and supplies selected one to the subcode encoder 11. Note that the time code information switching circuit 10 selects time code information sent from the master data supply unit 2 whenever it is sent therefrom, and selects time code information sent from the time code information generator 9 when no time code information is sent from the master data supply unit 2.

The subcode encoder 11 encodes sector number information sent from the control unit 20 and other additional information into a predetermined format, and supplies the encoded information to a CRC encoder 12. The other additional information mentioned above refers to copyright management information, time code information sent from the time code information switching circuit 10, and entry point information, picture header information, picture type information or temporal reference information sent from the video encoder 5.

Further additional information may include layer information, track number, application identification number, and application information inputted from an input unit not shown. If the application identification number indicates, for example, DVD, the application information has the entry point information sent from the video encoder 5.

The CRC encoder 12 calculates CRC for subcode information sent from the subcode encoder 11, adds the CRC data to the subcode information, further calculates EDC, adds the EDC to the subcode information, and supplies the subcode information with the additional CRC and EDC to a synchronization pattern adding circuit 13. The synchronization pattern adding circuit 13, in turn, adds the synchronization pattern shown in FIG. 5 to the supplied subcode information and supplies them to a subcode buffer 14. The subcode adding circuit 15 inserts the subcode information read from the subcode buffer 14 at the boundary of each sector in data sent from the multiplexer circuit 8. The position at which the subcode information is inserted is determined on the basis of a sector boundary signal sent from the multiplexer circuit 8. An ECC encoder 16 uses multiplexed data sent from the subcode adding circuit 15 to calculate C1 and C2 parities, i.e., ECC in accordance with Reed-Solomon code, adds the ECC to the multiplexed data, and supplies them to a modulator circuit 17.

The modulator circuit 17 is a circuit for modulating data sent from the ECC encoder 16 to a signal format recordable on the data recording medium 19, and performs EFM (Eight to Fourteen Modulation), by way of example. A writer unit 18 electrically, magnetically, optically, and/or physically records signals sent from the modulator circuit 17 on the data recording medium 19.

While in this embodiment, the ECC, i.e., the parities are calculated for and added to the multiplexed data after the subcode is added thereto, the data recording apparatus 1 may be constructed to add the subcode to the multiplexed data sent from the multiplexer circuit 8 after the ECC is added to the multiplexed data.

The control unit 20 supplies a supply command to the master data supply unit 2 and the computer 3 in accordance with editing instructions from the user, indicates the processing unit of read/write, i.e., the size of a sector for the data recording medium 19 to the multiplexer circuit 8, and supplies a time code generating command to the time code information generator 9. The control unit 20 also supplies a switching command to the time code switching circuit 10, receives a command related to copyright management, layer information, track number, application identification number, and application information from an input unit, not shown, and supplies the subcode encoder 11 with sector number information, copyright management information, layer information, track number, application identification number, and application information.

In the foregoing configuration, the control unit 20 first commands the master data supply unit 2 or the computer 3 to supply data in accordance with editing instructions from the user, and indicates the size of a sector to the multiplexer circuit 8. The control unit 20 also generates sector number information, copyright management information, layer information, track number, application identification number, and application information for recording in the subcode which are supplied to the subcode encoder 11. Further, if no time code information is sent from the master data supply unit 2, the control unit 20 commands the time code information generator 9 to generate time code information in accordance with instructions from the user.

The video encoder 5 encodes inputted video data in accordance with ISO11172-2 (MPEG1 Video) or ISO13818-2 (MPEG2 Video), and supplies the encoded video data to the multiplexer circuit 8. In this event, picture type information indicative of the type of an encoded picture (I-picture, P-picture, or B-picture) and temporal reference information are supplied to the subcode encoder 11. Also, when a picture header is sent, information indicating that a picture header exists is also supplied to the subcode encoder 11. In particular, when an I-picture is sent, information indicating that an I-picture header exists, i.e., entry point information is supplied to the subcode encoder 11.

The audio encoder 6 and the caption encoder 7 respectively encode an audio signal and a caption signal inputted thereto, and supply the encoded signals to the multiplexer circuit 8. The multiplexer circuit 8 multiplexes data sent from the video encoder 5, audio encoder 6, and caption encoder 7 in conformity to the stipulation of ISO11172-1 (MPEG1 System) or ISO13818-1 (MPEG2 System).

The user data divided into packets per sector by the multiplexer circuit 8 is supplied to the subcode adding circuit 15 and the CRC encoder 12. The multiplexer circuit 8 also supplies the subcode adding circuit 15 with a sector boundary signal which is set to "1" only when the first byte of user data, i.e., data indicative of the boundary of a sector is delivered and to "0" in other cases.

The subcode encoder 11 in turn creates subcode data in accordance with the subcode structures shown in FIGS. 6-10 and 18-24. More specifically, the subcode encoder 11 composes a subcode of a sector number and a time code (FIG. 6); the sector number and entry point information (FIG. 7); the sector number and picture header information (FIG. 8); the sector number and temporal reference (FIG. 9); the sector number and copyright management information (FIG. 10); or the copyright management information, layer information, sector number, track number, application identification number, and application information as shown in FIG. 18, all of which are extracted from the data sent thereto, and supplies the composed subcode to the CRC encoder 12. The CRC encoder 12 calculates CRC for the subcode data received from the subcode encoder 11, and adds the CRC immediately before the subcode data. The CRC encoder 12 further calculates EDC from the user data sent from the multiplexer circuit 8 and the subcode data with the CRC added thereto, and supplies the synchronization pattern adding circuit 13 with this EDC together with the subcode data with the additional CRC data.

The synchronization pattern adding circuit 13 adds a synchronization pattern (FIG. 5) immediately before the subcode data with the additional CRC data, and supplies the subcode data having the CRC data and the synchronization pattern to the subcode buffer 14. The subcode buffer 14 holes the sent data sequentially including the synchronization pattern, CRC, and subcode data and EDC so as to supply them to the subcode adding circuit 15 in response to a request from the subcode adding circuit 15.

The subcode adding circuit 15 requests the subcode buffer 14 to supply corresponding data sequentially including a synchronization pattern, CRC, and subcode data based on a sector boundary signal sent from the multiplexer circuit 8, inserts the requested data immediately before the user data sent from the multiplexer circuit 8, adds the EDC immediately behind the user data, and supplies the ECC encoder 16 with the user data having the subcode data and EDC added thereto.

The ECC encoder 16 calculates ECC for the multiplexed data sent from the subcode adding circuit 15, adds the calculated ECC to the multiplexed data, and supplies the multiplexed data with the ECC to the modulator circuit 17.

The modulator circuit 17 modulates the data sent from the ECC encoder 16, and supplies the modulated data to the writer unit 18 which in turn records the sent data on the data recording medium 19.

According to the foregoing configuration, in parallel with processing for recording video data, audio data, caption data, data composed of a plurality of these data, and data produced on a computer in the unit of sector, a time code, entry point information, picture header information, temporal reference, copyright management information, layer information, track number, application identification number, or application information is generated as a subcode, and added to an associated sector, thereby making it possible to realize a data recording apparatus which can add useful subcode information on the reproduction side with a simple configuration.

(3) Data Reproducing Apparatus According to Embodiment

Figure 2:
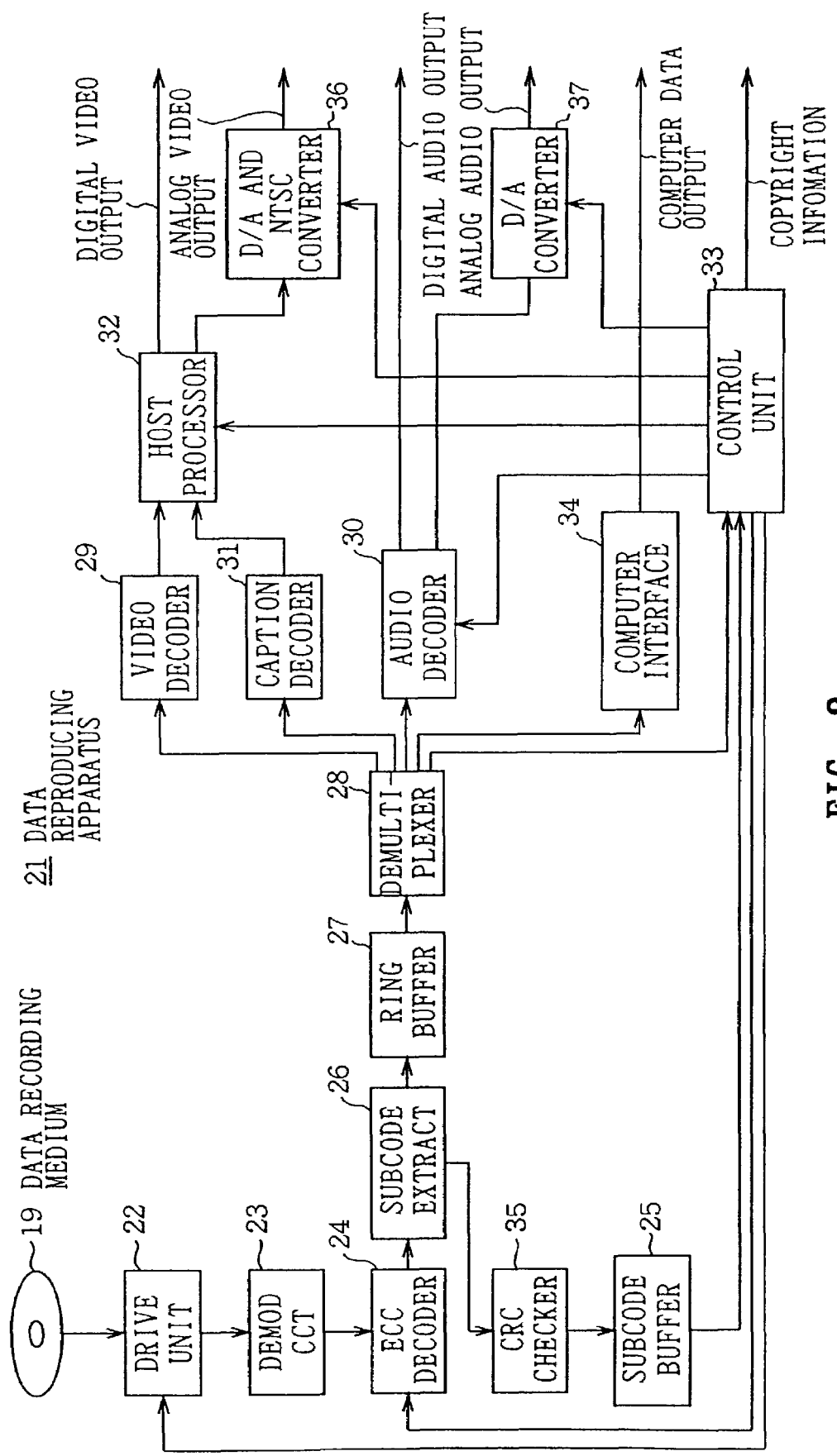
FIG. 2 is a block diagram showing the configuration of an embodiment of a data reproducing apparatus according to the present invention.

Referring now to FIG. 2, reference numeral 21 generally designates a data reproducing apparatus which reads video data, audio data, caption data, data composed of a plurality of these data, and data reproduced on a computer together with additional information from the data recording medium 19 on which such data is recorded in accordance with the data recording format of the present invention described above with reference to FIGS. 3-17 and 18-24.

In this data reproducing apparatus 21, a drive unit 22 performs mechanical mounting and dismounting of a data recording medium 19, as well as drives a pickup for reading signals from the data recording medium 19, which may be an optical head, a magnetic head, or a magneto-optical head, reads signals from the data recording medium 19 by means of the pickup, and supplies a demodulator circuit 23 with consequently reproduced signals.

The demodulator circuit 23 demodulates signals sent from the drive unit 22, and supplies the demodulated data to an ECC decoder 24. A demodulating method employed herein corresponding to the modulating method employed in the modulator circuit 16, and may be, for example, EFM demodulation.

The ECC decoder 24 performs calculations based on multiplexed data and C1 of ECC or C1 and C2 of ECC sent from the demodulator circuit 23 to detect whether errors are included in the multiplexed data and ECC. In this event, correctable errors in the multiplexed data, if detected, are corrected, and the ECC is removed from the multiplexed data. Then, the multiplexed data free from errors, which have been detected and corrected, is supplied to a subcode extracting unit 26. In this event, the ECC decoder 24 adds an error flag, for example, to every eight bits of the multiplexed data to be outputted. The error flag is set to "0" when associated eight bits of the multiplexed data include no error or when errors have been completely corrected, and to "1" when errors were uncorrectable.

The subcode extracting unit 26 extracts subcode data and CRC from every one-sector portion of the multiplexed data sent from the ECC decoder 24 based on a synchronization pattern thereof, supplies the extracted data and CRC to a CRC checker 35, and also supplies the multiplexed data including the subcode from the ECC decoder 24 to a ring buffer 27.

The CRC checker 35 calculates CRC included in the subcode data sent from the subcode extracting unit 26 to detect whether errors are included in the subcode data. The subcode data is sent to a subcode buffer 25 if no error is detected, whereas it is not sent to the subcode buffer 25 if any error is detected. The subcode buffer 25 temporarily holds the subcode data and supplies the held data to a control unit 33 in response to a request therefrom.

The ring buffer 27 is a memory for eliminating rate fluctuations caused by variable rate recording, which has a FIFO memory therein for temporarily buffering the multiplexed data and the error flag sent from the subcode extractor 26 and for supplying the buffered data to a demultiplexer 28 in response to a request therefrom.

It should be noted that while subcode information is extracted immediately after performing an error correction in the configuration of this embodiment, the subcode information may be extracted, for example, immediately before the error correction.

The demultiplexer 28 decomposes data sent from the ring buffer 27 into a video stream, an audio bit stream, a caption bit stream, subcode data and other bit streams in accordance with the stipulation of ISO11172-1 (MPEG1 System) or ISO13818-1 (MPEG2 System). Within these decomposed bit streams, the video bit stream is supplied to a video decoder 29; the audio bit stream to an audio decoder 30; the caption bit stream to a caption decoder 31; the subcode data to the control unit 33; and the other bit streams, which may be regarded as computer data, to a computer interface 34.

The video decoder 29 decodes the video bit stream sent from the demultiplexer 28 in conformity to ISO11172-2 (MPEG1 Video) or ISO13818-2 (MPEG2 Video) and supplies the decoded digital video signal to a host processor 32.

The audio decoder 30 decodes the audio bit stream sent from the demultiplexer 28 in conformity to ISO11172-3 (MPEG1 Audio) or ISO13818-3 (MPEG2 Audio) and outputs the decoded digital audio signal to a digital audio output terminal and to a D/A convertor 37. Alternatively, the outputting of the digital audio signal to the digital audio output terminal may be prohibited by a command from the control unit 33.

The caption decoder 31 expands the caption bit stream sent from the demultiplexer 28, if it has undergone run-length compress, and then supplies the expanded caption data to the host processor 32. The host processor 32 in turn superimposes the caption data sent from the caption decoder 31 on the video data sent from the video decoder 29, and outputs the superimposed digital video signal to a digital video output terminal, and to a D/A and NTSC converter 36. Alternatively, the outputting of the digital video signal to the digital video signal output terminal may be prohibited by a command from the control unit 33.

The control unit 33 controls the ECC decoder 24, the demultiplexer 28, the video decoder 29, the caption decoder 31, the host processor 32, and so on based on a variety of instructions inputted from the user through an input unit, not shown. The control unit 33 also sends a command to the drive unit 22 to start reading the data recording medium 19, issues a seek command to the drive unit 22 to seek certain data, issues a normal reproduction recover command to the drive unit 22 to resume normal reproduction from a seek operation, read subcode data from the subcode buffer 25, and issues the seek command and the normal reproduction recover command based on the subcode data. Incidentally, in this embodiment, the control unit 33 fetches a subcode also from the demultiplexer 28. This is because temporary storage of data in the ring buffer 27 causes a delay in data outputted from the ring buffer 27, so that a subcode extracted by the subcode extracting unit 26 presents a time difference from a subcode for a sector corresponding to current video bit stream, audio bit stream, caption bit stream and other bit stream which are being decomposed by the demultiplexer 28. For this reason, the control unit 33 fetches a subcode also from the demultiplexer 28 during normal reproduction in order to obtain a time code, a sector number and so on in a subcode for a sector corresponding to data which is currently being decomposed and is actually ready for decoding.

The computer interface 34 temporarily holds bit streams sent from the demultiplexer 28, converts electric characteristics, signal format and data format of the bit streams so as to permit a computer to receive them, and outputs the converted data to a computer data output.

The D/A and NTSC convertor 36 converts a digital video signal sent from the host processor 32 to an analog video signal, encodes the analog video signal to an NTSC signal, and outputs the NTSC encoded signal to an analog video output terminal. Alternatively, the convertor 36 may be prohibited from outputting the video signal to the analog video output terminal by a command from the control unit 33. The D/A convertor 37 converts a digital audio signal sent from the audio decoder 30 to an analog audio signal, and outputs the analog audio signal to an analog audio output terminal. Alternatively, the D/A convertor 37 may be prohibited from outputting the analog audio signal to the analog audio output terminal by a command from the control unit 33.

Although not shown, an EDC checker may be provided at the rear stage of the ECC decoder to detect errors in user data using EDC in multiplexed data.

In the foregoing configuration, the control unit 33 first receives reproduction instructions from the user, and issues a seek command to the drive unit 22. The drive unit 22 moves the pickup to a predetermined position to read a signal from the data recording medium 19, and supplies the read signal to the demodulator unit 23. The signal from the drive unit 22 is demodulated by the demodulator 23 and supplied to the ECC decoder 24. The ECC decoder 24 performs error detection and correction using ECC consisting of C1 and C2 parities sent thereto together with multiplexed data to correct correctable errors, and supplies the multiplexed data free from errors to the subcode extracting unit 26. The subcode extracting unit 26 detects a synchronization pattern from the supplied multiplexed data, and supplies a subcode and CRC to the CRC checker 35 and the multiplexed data to the ring buffer 27, respectively, based on the position of the detected synchronization pattern.

The user data or multiplexed data sent to the ring buffer 27 is supplied to the demultiplexer 28, and therein decomposed into a video bit stream, an audio bit stream, a caption bit stream, subcode data, and other bit stream, each of which is supplied to the video decoder 29, the audio decoder 30, the caption decoder 31, the control unit 33, and the computer interface 34, respectively.

The video bit stream sent to the video decoder 29 is. decoded therein and supplied to the host processor 32. The audio bit stream sent to the audio decoder 30 is decoded therein and outputted to the digital audio output terminal and to the D/A convertor 37. The digital audio signal sent to the D/A convertor 37 is converted into an analog audio signal and outputted to the analog audio output terminal.

The caption bit stream sent to the caption decoder 31 is expanded, if it has undergone run-length compress, and supplied to the host processor 32. The host processor 32 superimposes the caption data sent from the caption decoder 31 on the video data sent from the video decoder 29, and outputs the superimposed video data to the digital video output terminal and to the D/A and NTSC convertor 36.

When subcode data is held in the subcode buffer 25, the control unit 33 read out the subcode data to empty the subcode buffer 25. When a subcode read from the subcode buffer 25 or the demultiplexer 28 is in the form shown in FIG. 10, the control unit 33 refers to copyright management information included in the subcode data to issue an output enable command or an output disable command for the respective digital and analog output terminals for video and audio signals. When a corresponding byte of the copyright management information is other than "0", the control unit 33 commands the host processor 32, the D/A and NTSC convertor 36, the audio decoder 30, and the D/A convertor 37 to disable outputting the video and audio signals.

When the read subcode data is in the form shown in FIG. 6, it is assumed that a search is made based on a time code specified by the user during normal reproduction. The control unit 33 stores a time code of currently reproduced data from subcode data thereof during normal reproduction. When a new search is instructed by the user, the stored time code is compared with a time code specified by the user. Then, the control unit 33 commands the drive unit 22 to move the pickup toward the direction in which data corresponding to the specified time code exists, i.e., from a current sector in the direction of increasing or decreasing the sector number of the current sector, for reading the data.

A subcode of the data read from a sector to which the pickup has been moved is sent through the demodulator circuit 23, the ECC decoder 24, the subcode extracting unit 26, the CRC checker 35, and the subcode buffer 25 to the control unit 33 which reads, from the subcode, a time code in the subcode corresponding to the sector. If the time code of the sector to which the pickup has been moved is not coincident to or sufficiently close to the time code specified by the user, the control unit 33 again commands the drive unit 22 to move the pickup to repeat the above-mentioned operations. when the time code of a sector to which the pickup has been moved is coincident to or sufficiently close to the time code specified by the user, the search operation is stopped to resume normal reproduction from the position at which the pickup is currently placed. In this way, since the search operation is performed using the time code added as a subcode, the data reproducing apparatus 21 provides high-speed random access.

When the read subcode data is in the form shown in FIG. 7, a search is made based on an entry point when instructed by the user during normal reproduction. The control unit 33, responsive to instructions from the user, commands the drive unit 22 to move the pickup from a current sector in the direction of increasing or decreasing the sector number of the current sector by a predetermined amount to read multiplexed data from the data recording medium 19.

A subcode of the data read from a sector to which the pickup has been moved is sent through the demodulator circuit 23, the ECC decoder 24, the subcode extractor 26, the CRC checker 35, and the subcode buffer 25 to the control unit 33 which reads entry point information in the subcode corresponding to the sector. If an entry point flag is not set for the sector to which the pickup has been moved, the control unit 33 again commands the drive unit 22 to move the pickup to repeat the above-mentioned operations. If the entry point flag is set for the sector to which the pickup has been moved, the search operation is stopped to resume normal reproduction from the position at which the pickup is currently placed. In this event, since the entry point flag indicates the head position of an I-picture as described above, decoding can be started immediately after the search operation. Also, during the search operation, the entry point in a subcode extracted by the subcode extracting unit 26 is used without demultiplexing and decoding the multiplexed data, so that high speed random access can be achieved.

When the read subcode data is in the form of FIG. 8 with picture header information described as shown in FIG. 14, a search is made based on a picture header flag, when instructed by the user during normal reproduction. The control unit 33, responsive to instructions from the user, commands the drive unit 22 to move the pickup from a current sector in the direction of increasing or decreasing the sector number of the current sector by a predetermined amount to read multiplexed data from the data recording medium 19.

A subcode of the data read from a sector to which the pickup has been moved is sent through the demodulator circuit 23, the ECC decoder 24, the subcode extracting unit 26, the CRC checker 35, and the subcode buffer 25 to the control unit 33 which reads the picture header flag in the subcode. If the picture header flag is not set for the sector to which the pickup has been moved, the control unit 33 again commands the drive unit 22 to move the pick up to repeat the above-mentioned operations. Conversely, if the picture header flag is set for the sector to which the pickup has been moved, the control unit 33 stops the search operation to resume normal reproduction from the position at which the pickup is currently placed. In this way, a sector including the head position of a picture can be promptly accessed without demultiplexing and decoding the multiplexed data.

If the read subcode data is in the form of FIG. 8 with the picture information described as shown in FIG. 15, a search operation can be performed such that only I-picture is selectively read and decoded. With this subcode structure, a search, when instructed from the user during normal operation, is made based on the picture type in the subcode. The control unit 33, responsive to instructions from the user, commands the drive unit 22 to move the pickup from a current sector in the direction of increasing or decreasing the sector number of the current sector to read data from the data recording medium 19.

A subcode of the data read from a sector to which the pickup has been moved is sent through the demodulator 23, the ECC decoder 24, the subcode extracting unit 26, the CRC checker 35, and the subcode buffer 25 to the control unit 33 which reads the picture type in the subcode. If the picture type of a sector to which the pickup has been moved does not indicate an I-picture, the control unit 33 again commands the drive unit 22 to move the pickup. If the pickup type of a sector to which the pickup was newly moved indicates I-picture, video data in this sector is supplied to the video decoder 29. Thereafter, the control unit 33 repeatedly commands the drive unit 22 to move the pickup. In this way, a sector including I-picture data can be accessed promptly without demultiplexing and decoding multiplexed data. When the I-picture data thus obtained is decoded, exclusive reproduction of I-picture can be selectively realized.

With a similar procedure, I-picture and P-picture only can be selectively reproduced by skipping sectors, the subcode of which has the picture type indicating a B-picture.

Incidentally, when the subcode data is in the form of FIG. 8 with the picture header information described as shown in FIG. 14, a sector including the head of a picture header is not always a sector including a picture header of an I-picture. The video decoder 29 therefore requires an operation for deleting read data until a sector including an I-picture is detected. Thus, although the search operation can be made faster to some degree, it is impossible to immediately start decoding. Also, when the subcode data is in the form of FIG. 8 with the picture header information described as shown in FIG. 15, the first derived I-picture data may not include a picture header, so that part of data must be deleted in the video decoder 29.

In consideration of the foregoing, if the subcode data is in the form shown in FIG. 8 with the picture header information described as shown in FIG. 16, a sector including a picture header of an I-picture can be specified, so that a search operation can be realized by faster selective reproduction of picture. Further, with the subcode data in the format of FIG. 9, when the user specifies a temporal reference number, a search is made based on temporal reference n the subcode. The control unit 33, responsive to instructions from the user, commands the drive unit 22 to move the pickup from a current sector in the direction of increasing or decreasing the sector number of the current sector by a predetermined amount to read multiplexed data from the data recording medium 19.

A subcode of the data read from a sector to which the pickup has been moved is sent through the demodulator 23, the ECC decoder 24, the subcode extracting unit 26, the CRC checker 35, and the subcode buffer 25 to the control unit 33 which reads the temporal reference in the subcode. The control unit 33 commands the drive unit 22 to move the pickup to repeat the above-mentioned operations until the temporal reference for the sector to which the pickup has been moved is coincident with the temporal reference number specified by the user. In this way, data indicated by the temporal reference number specified by the user can be promptly accessed without demultiplexing and decoding the multiplexed data.

Likewise, when the subcode data is in the form shown in FIG. 18, random access to a particular track number, access to a sector having a particular application identification number, and random access using application information (entry point information is written herein), for example, when the application identification number indicates DVD, can be promptly performed respectively without demultiplexing and decoding data.

More specifically, when the user instructs the control unit 33 to access a particular track number during normal reproduction, the control unit 33 stores a track number of currently reproduced data, derived from subcode data of the currently reproduced data, during normal reproduction, compares this track number with the track number specified by the user for a new search, and commands the drive unit 22 to move the pickup toward the direction in which data having the specified track number exists from a current sector in the direction of increasing or decreasing the sector number of the current sector to read data therefrom.

A subcode of the data read from a sector to which the pickup has been moved is sent through the demodulator 23, the ECC decoder 24, the subcode extracting unit 26, the CRC checker 35, and the subcode buffer 25 to the control unit 33 which reads a track number in the subcode corresponding to the sector. If the track number read from the sector to which the pickup has been moved is not coincident with the track number specified by the user, the control unit 33 again commands the drive unit 22 to move the pickup to repeat the above-mentioned operations. If the track number read from the sector to which the pickup has been moved is coincident with the track number specified by the user, the control unit 33 stops the search operation to resume normal reproduction from the position at which the pickup is currently placed. In this way, since data is accessed using a track number added as the subcode without demultiplexing and decoding the multiplexed data, fast, random access can be achieved. Likewise, using the application information in which entry point information is described, fast random access can be performed similarly to the case of the aforementioned FIG. 7.

Also, when the subcode data is in the form shown in FIG. 18, the control unit 33 can determined whether a sector including data associated with a target application has been read by fetching an application identification number.

Further, when the subcode data is in the form shown in FIG. 18, assume that a two-layer disc is reproduced. A subcode of data read fro the disc is supplied to the controller 33 through the demodulator unit 23, the ECC decoder 24, the subcode extracting unit 26, the CRC checker 35, and the subcode buffer 24, or through the demodulator unit 23, the ECC decoder 24, the subcode extracting unit 26, the ring buffer 27, and the demultiplexer 28. The control unit 33 fetches a number of layers and a layer number of a currently read sector. If the layer number of the currently read sector is different from a target layer number, the control unit 33 commands the drive unit 22 to switch the currently read layer to the other layer. A read signal from the switched layer is supplied to the control unit 33 through a similar path. Then, if the layer number of a sector from which the signal is being read is equal to the target layer number, reproduction is continued.

Further, when the subcode data is in the form of FIG. 18, the control unit 33 reads copyright management information in the subcode, and controls the outputs of the host processor 32, the D/A and NTSC convertor 36, and the D/A convertor 37 in accordance with the contents of the copyright management information. If the subcode indicates that duplication is permitted only once, this information is delivered to externally connected equipment.

When the above-mentioned search operations and random access are performed, the control unit 33 commands the ECC decoder 24 to change an error correction mode. This causes the ECC decoder 24 to perform the error correction only with the C1 parity in multiplexed data. In this way, the subcode data can be fetched more promptly. Of course, if the error correction was performed with both C1 and C2 parities as is the case of normal reproduction, the error correction capability would be enhanced. However, the error correction with the C1 and C2 parities would result in delaying in extracting the subcode data.

According to the foregoing configuration, when a data recording medium 19 on which video data, audio data, caption data, data composed of a plurality of these data, and data produced on a computer are recorded in the unit of sector together with a time code, entry point information, picture header information, temporal reference, or track number as a subcode added to each sector, is reproduced at a variable data rate, by separately reproducing the subcode alone, it is possible to realize a data reproducing apparatus which provides remarkable improvements in the usability for special reproduction, search and reproduction, and so on.

Also, since information on copyright is additionally recorded as a subcode for each sector on the data recording medium 19 and this subcode is extracted when reproducing the data recording medium 19 for use in copyright management, detailed copyright management can be realized for each sector.

Further, since layer information is additionally recorded as a subcode for each sector on the data recording medium 19 and this subcode is extracted when reproducing the data recording medium, it is possible to realize a data reproducing apparatus which can reproduce recorded data extending over a plurality of layers with a simple configuration.

Further, since an application identification number and application information area recorded in each sector as a subcode on the data recording medium and this subcode is extracted when reproducing the data recording medium for controlling reproduction, it is possible to realize a data reproducing apparatus which provides remarkable improvements in the usability.

(4) Other Embodiments

While in the foregoing embodiment, a subcode extracted by the subcode extracting unit 26 is used when performing a search operation or random access, a subcode separated by the demultiplexer 28 may also be used for the purpose. It should be noted however that since the ring buffer 27 causes a delay as described above, an improvement in operating speed will be limited as compared with the foregoing embodiment.

While the foregoing embodiment has been described for the case where a subcode is recorded in each sector prior to user data, the arrangement of the subcode is not limited to this. The subcode may be contained in 2,048 bytes of user data as other raw data different from the user data, or may be contained as data having a particular packet header. Further alternatively, the subcode may be located in a data management area which is reserved separately from a data recording area, i.e., a so-called TOC (Table of Contents) area in a compact disc or the like.

While in the foregoing embodiment, the subcode has a length of 14 bytes and the user data has a length of 2,048 bytes, the lengths of the subcode and the user data are not limited to these values and may be arbitrary selected as required. Also, the length of the error correction code calculated for the subcode and the user data may be arbitrarily selected in accordance with requirements to the error correction and detection capability and so on.

The foregoing embodiment has been described for the case where ECC consisting of Reed-Solomon codes is added to the user data as an error correction code while CRC and EDC are added to the subcode as an error detection code. However, the kinds of error correction and detection codes are not limited to the above. The point is that if the error correction and detection codes are selected such that the subcode is reproduced easier than the user data in view of a calculation time and so on upon reproduction, similar effects to those of the foregoing embodiment can be realized.

While the foregoing embodiment has been described for the case where time code information, entry point information, picture header information, temporal reference information, copyright management information, layer information, track number or application identification number is added as a subcode, similar effect as those of the foregoing embodiment can be realized also by combining them or by adding other additional information for data reproduction as a subcode, as required.

In the foregoing embodiment, one packet of video data, audio data, caption data, data composed of a plurality of these data, and data produced on a computer is created so as not to extend over a plurality of sectors. Alternatively, a region in which one or a plurality of audio/video tracks are recorded as user data may be regarded as one file in a file system such that a computer can manage and modify an assignment situation of a region for computer data and programs and a region for recording audio/video data on a data recording medium. Further, in this case, the TOC area may be treated as a virtual directory in the file system, and audio/video data may be treated as files existing in the directory such that the audio/video data can be read from and written into a computer system.

While the foregoing embodiment has been described for the case where the present invention is applied to recording and reproducing of video data, audio data, caption data, data composed of a plurality of these data, and data produced on a computer based on the stipulation of ISO11172 (MPEG1) or ISO13818 (MPEG2), the present invention is not limited to this but is suitable for wide applications to data recording methods and apparatus, data recording media, and data reproducing methods and apparatus which treat a variety of data.

While in the foregoing embodiment, the multiplexed data is assumed to be variable rate data, of course, it may be fixed rate data.

While the foregoing embodiment has been described on the assumption that the data recording medium 19 formed by the data recording apparatus 1 is directly utilized as the data recording medium 19 to be reproduced by the data reproducing apparatus 21, a recording medium reproduced by the data reproducing apparatus 21 may be one of recording media mass-produced by a stamper or the like from the data recording medium 19 formed by the data recording apparatus 1 used as a master recording medium.

According to the present invention as described above, by virtue of additional information for data reproduction serving as a subcode separately from data in each sector, which is added when the data is recorded on a data recording medium in the unit of sector, it is possible to realize a data recording method and apparatus as well as a data recording medium which can control data reproduction using the subcode and hence can remarkably improve the usability of the data recording medium.

Also, according to the present invention as described above, upon reproducing a data recording medium which has a subcode serving as additional information for data reproduction in each sector separately from data, which was added when the data was recorded in the unit of sector, the subcode recorded in each sector is reproduced separately from reproduction of data recorded in each sector, in order to control the reproduction of the data, thereby making it possible to realize a data reproducing method and apparatus which can support a variety of reproducing methods and improve the usability.

INDUSTRIAL AVAILABILITY

The data recording method and apparatus of the present invention may be utilized to record compressed digital images, compressed digital speech and so on in a multiplex manner to create DVD (Digital Video Disc). The data recording medium of the present invention, in turn, may be utilized as DVD on which compressed digital images, compressed digital speech and so on are recorded in a multiplex manner. Further, the data reproducing method and apparatus of the present invention may be utilized to reproduce data from DVD on which compressed digital images, compressed digital speech and so on are recorded in a multiplex manner.

The invention claimed is:

1. A computer readable medium storing computer readable information which when accessed by a data reproducing apparatus causes the data reproducing apparatus to decode stored picture information, the computer readable medium comprising:

a plurality of sectors each including a user data field and a subcode field;

at least one of the user data fields includes data representative of a plurality of still pictures accessible by the data reproducing apparatus for decoding, including a number of intra-frame (I) pictures, predictively coded (P) pictures, and bidirectionally coded (B) pictures; and each of the subcode fields is arranged separately from said user data field and each of the subcode fields includes a sector number field and a selectable field, the sector number field includes a sector number to identify a corresponding sector that includes the sector number field, a first at least one of the subcode fields includes, as the selectable field, a predetermined time code for the plurality of still pictures in the user data field included in the corresponding sector, a second at least one of the subcode fields includes, as the selectable field, entry point information for use in a high-speed search operation and indicating that one or more I pictures is located in the user data field included in the corresponding sector, a third at least one of the subcode fields includes, as the selectable field, temporal reference information which indicates an order for displaying the plurality of still pictures in the user data field in the corresponding sector and which enables access to a desired still picture selected by a user from among the plurality of still pictures in the user data field in the corresponding sector, and a fourth at least one of the subcode fields includes, as the selectable field, copyright information that identifies, to the data reproducing apparatus, a sector copyright limitation of the user data field in the corresponding sector, the sector copyright limitation configured to instruct the data reproducing apparatus to differently limit each of a digital copy output, an analog audio output, and an analog video output of the data reproducing apparatus.

2. The computer readable medium according to claim 1, wherein said user data field further includes audio data, caption data, multiplexed data, or computer data.

3. The computer readable medium according to claim 1, wherein a fifth at least one of the subcode fields includes, as the selectable field, picture type information representing a type of a picture included in the user data field in the corresponding sector, when video data in accordance with the stipulation of ISO11172 (MPEG1) or ISO013818 (MPEG2) is recorded in said user data field.

4. The computer readable medium according to claim 1, wherein the fourth at least one of the subcode fields includes, as the selectable field, four bytes of copyright information in which a first one of said four bytes identifies a copyright limitation for digital video data stored in the user data field in the corresponding sector, a second one of said four bytes identifies a copyright limitation for digital audio data stored in the user data field in the corresponding sector, a third one of said four bytes identifies a copyright limitation for analog video data stored in the user data field in the corresponding sector, and a fourth one of said four bytes identifies a copyright limitation for analog audio data stored in the user data field in the corresponding sector.

5. The computer readable medium of claim 4, wherein the copyright limitation stored in one of the four bytes is different than the copyright limitation stored in another one of the four bytes.

6. A system for decoding picture information includes an information retrieval device and a computer readable medium, the information retrieval device configured to retrieve information from the computer readable medium, and the computer readable medium comprising:

a plurality of sectors each including a user data field and a subcode field;

at least one of the user data fields includes data representative of a plurality of still pictures accessible by the information retrieval device including a number of intra-frame (I) pictures, predictively coded (P) pictures, and bidirectionally coded (B) pictures; and each of the subcode fields is arranged separately from said user data field and each of the subcode fields includes a sector number field and a selectable field, the sector number field includes a sector number to identify a corresponding sector that includes the sector number field, a first at least one of the subcode fields includes, as the selectable field, a predetermined time code for the plurality of still pictures in the user data field included in the corresponding sector, a second at least one of the subcode fields includes, as the selectable field, entry point information for use in a high-speed search operation and indicating that one or more I pictures is located in the user data field included in the corresponding sector, a third at least one of the subcode fields includes, as the selectable field, temporal reference information which indicates an order for displaying the plurality of still pictures in the user data field in the corresponding sector and which enables access to a desired still picture selected by a user from among the plurality of still pictures in the user data field in the corresponding sector, and a fourth at least one of the subcode fields includes, as the selectable field, copyright information that identifies, to the information retrieval device, a sector copyright limitation of the user data field in the corresponding sector, the sector copyright limitation configured to instruct the information retrieval device to differently limit each of a digital copy output, an analog audio output, and an analog video output of the information retrieval device.

* * * * *